United States Patent
Franz et al.

(10) Patent No.: US 12,104,618 B2
(45) Date of Patent: Oct. 1, 2024

(54) AXIAL PUMP WITH ADJUSTABLE IMPELLER

(71) Applicant: HEWLETT PACKARD ENTERPRISE DEVELOPMENT LP, Houston, TX (US)

(72) Inventors: John P. Franz, Tomball, TX (US); Steven J. Dean, Chippewa Falls, WI (US); Ernesto J. Ferrer, Aguadilla, PR (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/977,200

(22) Filed: Oct. 31, 2022

(65) Prior Publication Data

US 2024/0141926 A1    May 2, 2024

(51) Int. Cl.
| | |
|---|---|
| *F04D 29/042* | (2006.01) |
| *F04D 29/64* | (2006.01) |
| *H05K 7/20* | (2006.01) |

(52) U.S. Cl.
CPC ......... *F04D 29/648* (2013.01); *F04D 29/042* (2013.01); *F04D 29/642* (2013.01); *H05K 7/20254* (2013.01); *H05K 7/20272* (2013.01)

(58) Field of Classification Search
CPC .... F04D 29/042; F04D 29/566; F04D 29/642; F04D 29/648; H05K 7/20254; H05K 7/20272
See application file for complete search history.

(56) References Cited

U.S. PATENT DOCUMENTS

| | | | | |
|---|---|---|---|---|
| 2,378,974 | A | * | 6/1945 | Bower .................... F04D 29/20 415/199.2 |
| 5,692,882 | A | * | 12/1997 | Bozeman, Jr. ...... A61M 60/237 310/216.013 |
| 10,641,265 | B2 | | 5/2020 | Kimball et al. |
| 11,015,608 | B2 | * | 5/2021 | Franz ..................... F04D 13/06 |
| 11,131,315 | B2 | | 9/2021 | Miller et al. |
| 2006/0222537 | A1 | | 10/2006 | Kilty |

FOREIGN PATENT DOCUMENTS

JP          4336113  B2     9/2009

* cited by examiner

*Primary Examiner* — Topaz L. Elliott
*Assistant Examiner* — Jason G Davis
(74) *Attorney, Agent, or Firm* — Jones Robb PLLC

(57) ABSTRACT

An example axial pump for delivering liquid coolant to cool an electronic device comprises a conduit defining a flow path from an inlet of the conduit to an outlet of the conduit and an impeller in the conduit. The impeller is rotatable about an axis of rotation parallel to the flow path. The pump also has a motor stator configured to drive rotation of the impeller body about the axis of rotation. In addition, the pump comprises an adjustment mechanism coupling the impeller to the conduit. The adjustment mechanism is actuatable to cause translation of the impeller relative to the conduit. This may allow for adjustment of a clearance between a blade tip of a blade of the impeller and a wall of the conduit.

21 Claims, 10 Drawing Sheets

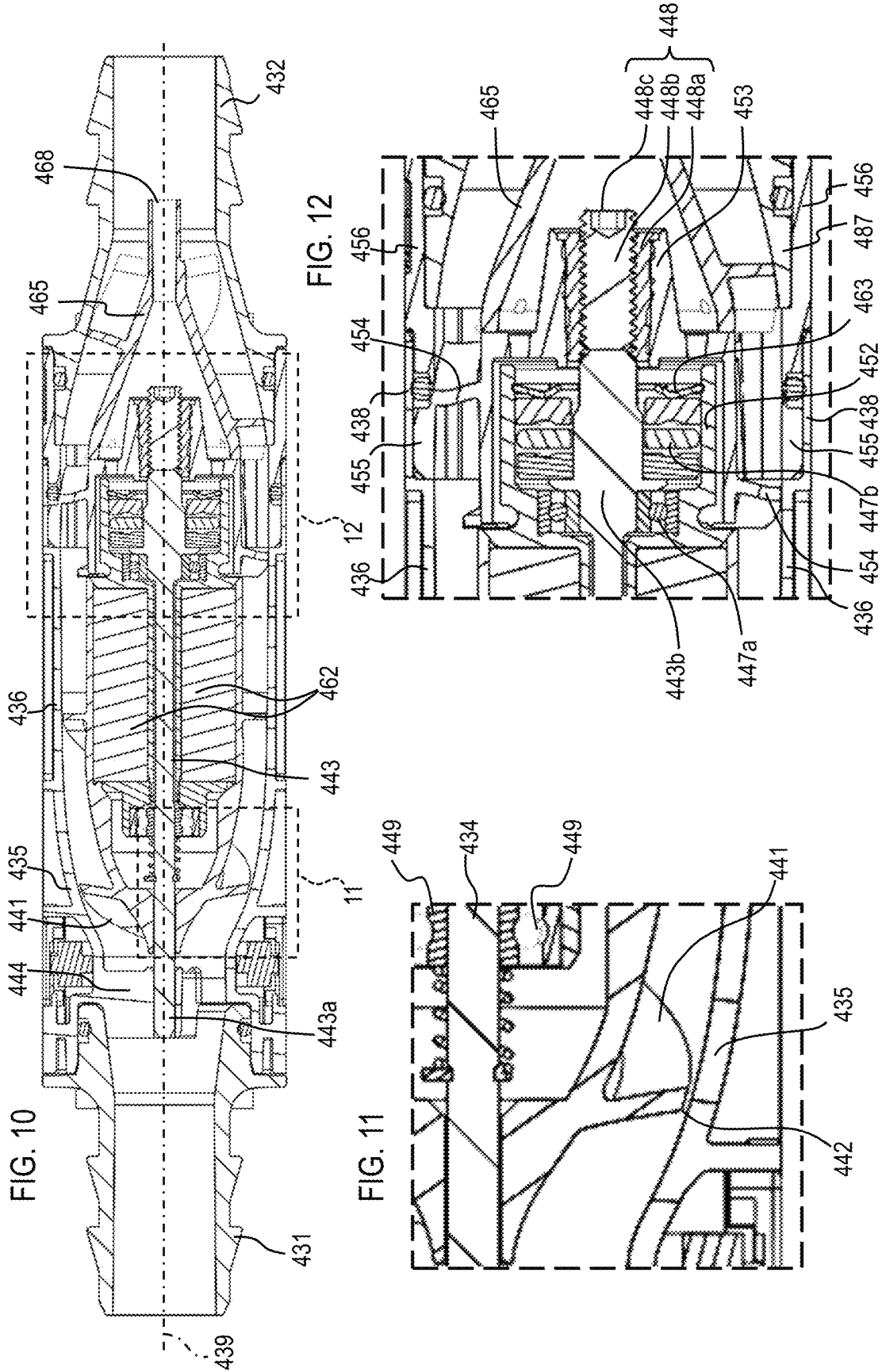

AXIAL PUMP WITH ADJUSTABLE IMPELLER

INTRODUCTION

Electronic devices, such as computers, networking devices, power supply units, etc., generate heat when in use. Cooling systems may be utilized to remove heat from components of the electronic devices to keep them within desired operating temperatures. For example, liquid cooling techniques may use flows of liquid coolant to remove heat from the systems. In liquid cooling techniques, a liquid coolant from a liquid coolant loop is disposed in thermal contact with the heat generating components of the electronic device via one or more thermal devices, such as cold plates, fluidically coupled with the liquid cooling loop. For example, in computing systems cold plates may be coupled to processors or other heat generating components of the system. The liquid coolant is caused to flow through the loop and, as the coolant passes through the thermal devices, heat from the heat generating components is absorbed by the liquid coolant, thus cooling the components. As the now-heated coolant exits the thermal devices, it carries the heat away and eventually flows through a cooling device configured to remove heat therefrom, such as a heat exchanger, radiator, chiller, or the like. After being cooled, the liquid coolant may then be returned to the one or more thermal devices to cycle through the loop once again. One or more pumps may be disposed within such a liquid cooling loop to cause the liquid coolant to flow through the loop.

BRIEF DESCRIPTION OF THE DRAWINGS

The present disclosure can be understood from the following detailed description, either alone or together with the accompanying drawings. The drawings and related description of the figures are included to provide a further understanding of the present disclosure and are incorporated in and constitute a part of this specification. The drawings illustrate one or more nonlimiting aspects and implementations of the present teachings and together with the description explain certain principles and operation. In the drawings:

FIG. 10 is a cross-section of the second pump taken along the plane 10-10 in FIG. 4.

FIG. 11 is an enlarged view of the region 11 in FIG. 10.

FIG. 12 is an enlarged view of the region 12 in FIG. 10.

DETAILED DESCRIPTION

Figure 1:
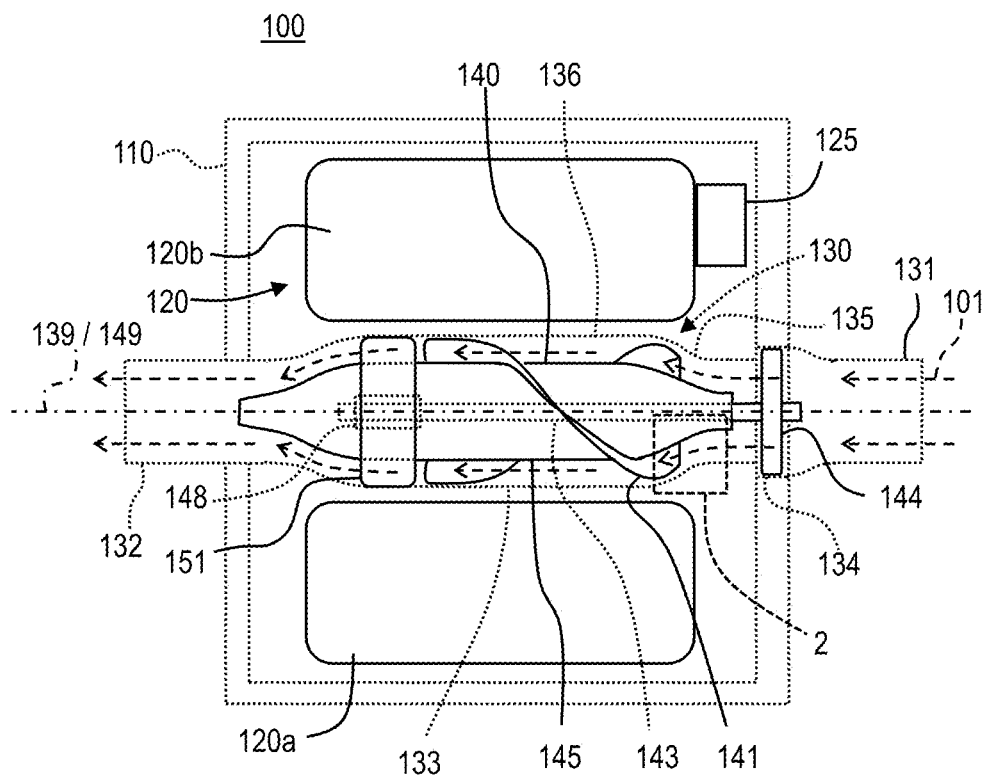
FIG. 1 is a schematic diagram illustrating a top view of a pump.

In some contexts, it may be desired to utilize a relatively small pump in a liquid cooling loop. For example, in some contexts it may be desired to provide small pumps within individual computing devices or other relatively small electronic devices (e.g., in contrast to the relatively larger pumps that are often disposed external to computing systems to drive flows through multiple devices). Such small form factor pumps may improve efficiency and performance of the liquid cooling loop, potentially reducing power usage and noise while also delivering more coolant flow (and hence better cooling). In addition, smaller pumps disposed locally to the devices they cool may also facilitate greater modularity and scalability of the system, as the pumping capacity of the system naturally scales along with the demand for cooling since each new device added to the system brings its own pump(s) with it.

To allow for pumps to be used locally to the devices to which they pump liquid coolant for cooling, the pumps generally need to be fairly small, particularly when it is desired to dispose the pump within a relatively limited space. For example, some enterprise-grade computing systems, such as high-performance computer systems, are particularly dense and often have very little free space inside. Accordingly, pumps used therewith may need to be rather small. Some small pumps have been developed, such as the micro-axial pumps described in U.S. patent Ser. No. 11/015, 608 B2, the contents of which are incorporated herein by reference in their entirety. An axial pump has an impeller (the part that moves within the liquid to drive the flow) that spins along an axis that is coaxial with a flow direction of the liquid, in contrast to centrifugal pumps which have impellers that spin along an axis transverse to the flow direction of the liquid. The micro-axial pumps described in U.S. Ser. No. 11/015,608 B2 allow for a relatively large reduction in the size of the pumps without compromising effectiveness or efficiency.

However, the small size and other aspects of the configuration of such micro-axial pumps can poses a variety of technical challenges. In particular, the performance of the micro-axial pump is highly dependent on the tip clearance between the blades of the spinning impeller and the surrounding walls of the impeller chamber—generally, the further the tips are from the surrounding walls, the worse performance is. While tip clearance also effects the performance of other pumps and fans, with micro-axial pumps the effect can be even more pronounced. In particular, the small size of the pumps means that a given amount of variance in the sizes of the impeller and/or impeller chamber (e.g., due to manufacturing tolerances) may disproportionately affect the micro-axial pump as compared to a larger pump. For example, a 0.5 mm variance in tip clearance on a conventional pump with an impeller having a radius of 50 mm may amount to a variance that is 1% of the impeller radius, whereas the same 0.5 mm variance in the impeller of a micro-axial pump having a radius of, for example, 10 mm amounts to a variance that is 5% of the impeller radius. Furthermore, the impeller chamber in the micro-axial pump design may comprise a sloping transition zone between an inlet and a central portion of the chamber, and this sloping wall may cause the tip clearance to have an even stronger impact on the performance of the pump. Thus, tip clearance may be even more impactful in micro-axial pumps than it has previously been in other pumps or fans.

While a relatively small tip clearance is important for performance, it is also important that the blade tip not contact the surrounding wall of the chamber, as this can degrade performance and also has the potential to damage the pump. Thus if the nominal tip clearance is too small, then due to manufacturing variations in the parts some impellers could have their tip contact the surrounding walls. Thus, the impeller design may need to account for the various manufacturing tolerances that could affect the tip clearance, and the nominal tip clearance may need to exceed the sum of these tolerances. In the micro-axial pump, a number of tolerances combine (stack) to determine the nominal minimum tolerance that would be desired to avoid the potential of the blade tip contacting the chamber wall. Among these tolerances are bearing tolerances, machining tolerances for machined components, injection mold parts tolerances (including required draft for the tooling), tolerances in the assembly of the components, and tolerances for the water absorption of plastic parts used in the pump. As a result of all these stacking tolerances, the minimum tip clearance that can safely be designed may be too large for optimal performance of the pump. In other words, the designed tip clearance cannot be set at the optimal value without risking the potential for blade tips striking the chamber walls. While reducing manufacturing tolerances by using more precise manufacturing techniques could help to reduce at least some of the various tolerances, cost considerations may not make such techniques feasible. Moreover, even the most precise of techniques may still leave tolerances that are too large for the desired tip clearance.

Accordingly, to solve at least some of the problems noted above (among other things), aspects of the present disclosure contemplate a micro-axial pump that has an impeller that can be adjusted to change the tip clearance between the blades of the impeller and the walls of the impeller chamber in which the impeller is disposed. More specifically, the impeller is adjustable in position axially, i.e., the impeller may be configured to translate along the axis of rotation of the impeller, and this translation permits changes to the tip clearance. In the micro-axial pump the impeller has a transition zone with walls sloped relative to the rotation axis of the impeller, as described above, and thus axial translation of the impeller may change the clearance between the blades and the sloped walls. When the impeller is translated axially in one direction (e.g., toward an inlet), the leading tips of the blades will get closer to the sloped chamber walls and tip clearance will reduce, and when the impeller is translated axially in the opposite direction (e.g., toward an outlet) the tips of the blades will get further from the sloped chamber walls and tip clearance will increase. Thus, a tip clearance selected to achieve desired pump performance can be obtained by adjusting the position of the impeller even if the initial tip clearance after manufacture produces less than desired performance. This may allow the impeller to be designed with a relatively generous nominal tip clearance, which may reduce manufacturing costs, while still allowing for the tip clearance that produces the desired level of performance to be achieved by adjusting the tip clearance post-manufacture. Accordingly, better pump performance may be achieved while keeping manufacturing costs low and also avoiding the risk of blade tip strikes.

Turning now to the figures, various devices, systems, and methods in accordance with nonlimiting aspects of the present disclosure will be described.

Figure 2A:
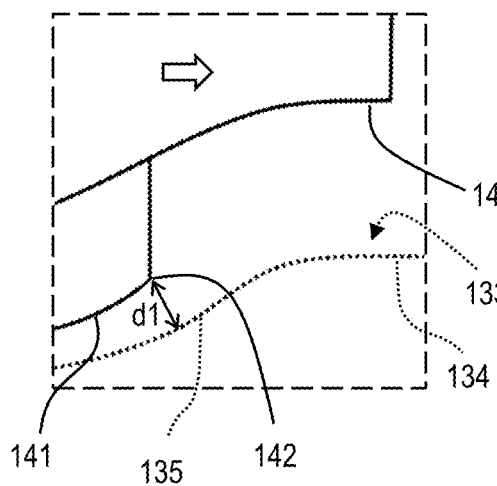
FIG. 2A is schematic diagram comprising an enlargement of the region labeled 2 in FIG. 1 showing the pump in a first state.
Figure 2B:
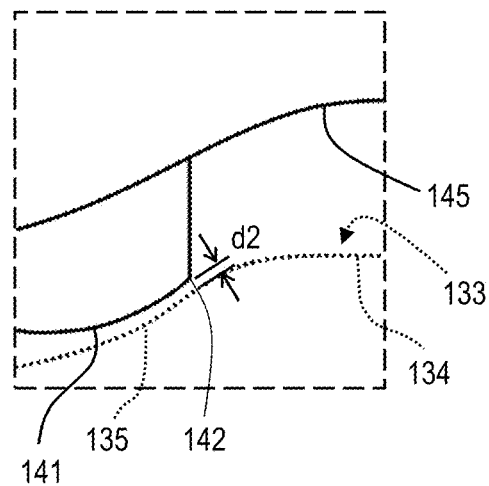
FIG. 2B is schematic diagram comprising an enlargement of the region labeled 2 in FIG. 1 showing the pump in a second state.

FIGS. 1-2B are schematic diagrams conceptually illustrating a pump 100. FIG. 1 comprises a schematic top view and FIGS. 2A and 2B comprise enlarged views of a region labeled 2 FIG. 1 in different states. It should be understood that FIGS. 1-2B are not intended to illustrate specific shapes, dimensions, or other structural details accurately or to scale, and that implementations of the pump 100 may have different numbers and arrangements of the illustrated components and may also include other parts that are not illustrated.

As shown in FIGS. 1-2B, the pump 100 comprises a housing 110, a motor stator 120 (also "stator 120"), one or more electrical components 125, a conduit 130 defining a liquid flow path 101, and an impeller 140. The housing 110 and conduit 130 are shown as transparent in dotted lines to allow visibility of the other components. A portion of a shaft 143 is also shown in dotted lines in FIG. 1 to indicate that it would be hidden in that view by the impeller 140. The components of the pump 100 will be described in greater detail below.

The housing 110 comprises one or more walls or other support structures that support and at least partially enclose or house some of the other components of the pump 100. The housing 110 may be a single part or made from multiple parts assembled together. In some examples, the parts of the housing 110 may also be coupled to and/or form an integral part of the other parts of the pump 100. For example, portions of the conduit 130 may also form parts of the housing 110.

The motor stator 120 is configured to receive electrical power from a PCA and in response generate alternating magnetic fields that interact with the impeller 140 to cause the impeller 140 to rotate about a rotation axis 149 thereof. The motor stator 120 may comprise wire windings or other electrically conductive materials to generate the magnetic fields and/or magnetically susceptible materials to transfer and distribute the generated fields around the impeller 140 in a desired pattern. In some examples, the motor stator 120 comprises two portions: a first stator portion 120a and a second stator portion 120b, as shown in FIG. 1. These portions 120a and 120b are arranged on opposite lateral sides of the conduit 130. U.S. Pat. No. 11,015,608 B2 describes example stators that are split into two portions, and these, for example, may be used as the motor stator 120. A person of ordinary skill in the art would be familiar with motor stators that may be used as the motor stator 120.

The pump 100 may also comprise one or more electrical components 125 that control operations of the pump 100. In some examples the electrical components 125 comprise control circuitry configured with logic to drive operations of the pump 100. For example, control circuitry may include a microcontroller. As another example, the control circuitry may include discrete logic circuits (digital or analog), in addition to or instead of a microcontroller. The electrical components 125 may also include sensors, such as temperature sensors, electrical power usage sensors, moisture sensors (e.g., for leak detection), magnetic field (e.g., Hall effect) sensors, or other sensors. The electrical components 125 may also include power delivery components, such as transistors or other switches (e.g., relays), capacitors, diodes, etc. In some examples, the electrical components 125 may include communications components for communicating with outside devices such as a system controller, baseboard management controller (BMC), rack controller, etc., for example via the cables (not illustrated) coupled to the pump 100 and/or wirelessly (via, e.g., Bluetooth, WiFi, etc.). The electrical components 125 may be electrically coupled to the motor stator 120 to provide electrical signals thereto to drive the operation of the motor stator 120. The electrical components 125 may be coupled to an outside power source via wires or cables (not illustrated).

The conduit 130 comprises walls that enclose a volume and define the liquid flow path 101 in that volume, with the liquid flow path 101 being the path along which liquid coolant (e.g., water or other coolants) flows as it traverses the pump 100. The conduit 130 comprises a pump inlet portion 131 (also "inlet 131"), a pump outlet portion 132 (also "outlet 132"), and an impeller chamber portion 133. The impeller chamber portion 133 houses the impeller 140 and is fluidically coupled to the inlet 131 and outlet 132. The pump inlet portion 131 and pump outlet portion 132 may comprise structures for fluidically coupling the pump with coolant lines of a liquid cooling loop, such as hose barbs, quick connect couplings, and/or other liquid coupling mechanisms as would be familiar to those of ordinary skill in the art. The conduit 130 may be liquid tight, sealing the interior volume from an exterior environment, other than at openings in the inlet 131 and outlet 132 that allow the enclosed interior volume to be fluidically coupled to the exterior environment (e.g., to coolant lines of a liquid cooling loop). In some examples, the inlet 131 and outlet 132 may extend outside of the housing 110 of the pump 100. In some examples, the impeller chamber portion 133 is contained within the housing 110.

In some examples, the impeller chamber 133 comprises an impeller chamber inlet portion 134 (also "inlet portion 134") which is coupled to the pump inlet portion 131, an impeller chamber central portion 136 (also "central portion 136"), and a transition zone 135 between the impeller chamber inlet portion 134 and the impeller chamber central portion 136. In some examples, the impeller chamber 133 comprises an impeller chamber outlet portion (not labeled) coupled to the pump outlet portion 132, and a second transition zone (not labeled) between the impeller chamber outlet portion and the impeller chamber central portion.

The conduit 130 has a central longitudinal axis 139, and liquid flowing through the conduit 130 flows, as whole, along directions parallel to the central longitudinal axis 139, as indicated by the dashed arrows representing the flow path 101 in FIG. 1 (portions of the liquid may occasionally flow at angles relative to the axis 139 along portions of the conduit 130, such as when the liquid is being moved around the impeller 140, but the bulk or average motion of the liquid as a whole in traversing the conduit 130 is along directions parallel to the axis 139). In some examples the liquid is present in the pump 100 only after the pump 100 has been deployed for use in a liquid cooling loop (e.g., coupled to coolant supply and return lines), while in other states (such as a state of the pump 100 upon manufacture), the liquid will not yet be present.

The impeller 140 is housed within the conduit 130, specifically in the impeller chamber 133 thereof, and is configured to rotate about a rotation axis 149 to drive liquid to flow along the flow path 101 through the conduit 130. The rotation axis 149 of the impeller 140 may also be a central longitudinal axis of the impeller 140, and these axes may also be aligned with the central axis 139 of the conduit 130.

The impeller 140 comprises an impeller body 145 and blades 141 that protrude radially from and spiral axially along the impeller body 145. The blades 141 are configured to force the liquid axially along the flow path 101 through the conduit 130 as the impeller 140 rotates. As shown in FIGS. 2A and 2B, the impeller blades 141 comprise blade tips 142, which comprise, for example, the portion of the blade 141 that is radially the farthest from the rotation axis 149 while also being axially the farthest from the outlet 132. The impeller 140 may be configured to rotate in response to the magnetic fields generated by the motor stator 120. For example, the impeller 140 may comprise permanent magnets and/or magnetically attractable (e.g., ferromagnetic) materials (e.g., iron, steel, etc.) (not illustrated) which are arranged around the impeller 140 so as to interact with the magnetic fields generated by the motor stator 120 to produce rotation of the impeller 140. Thus, the impeller 140 and the motor stator 120 may together form an electromagnetic motor, with the impeller 140 acting as the rotor portion of the motor. In some examples, the impeller 140 may comprise a tapered profile at one or both end portions thereof. In particular, in some examples a radius of the impeller 140 may be relatively small near the impeller chamber inlet portion 134, gradually increase throughout the transition zone 135, and reach a maximum within the impeller chamber central portion 136.

As shown in FIG. 1, the impeller 140 also comprises a shaft 143, and the impeller body 145 is coupled to the shaft 143 such that the impeller body 145 can rotate about the shaft 143 but is otherwise constrained such that no other relative motion can occur between the impeller body 145 and the shaft 143 (i.e., the shaft 143 and the impeller 140 are stationary relative to one another except for rotation of the impeller body 145 about the shaft 143). For example, in some implementations the impeller body 145 may be coupled to the shaft 143 via bearings (not illustrated) (e.g., ball bearings, plane bearings, etc.), such as axial bearings to provide for the relative rotation of the impeller body 145 about the shaft 143 and thrust bearings to keep the impeller body 145 from translating relative to the shaft 143. The shaft 143 is mounted to the impeller chamber 133 via a front support 144 that is coupled to the impeller chamber 133 and engages and holds a front portion of the shaft 143, and a rear support 151 that is coupled to the impeller chamber 133 and engages and holds a rear portion of the shaft 143. Front and rear are used herein in relation to the orientation of the pump 100 illustrated in FIG. 1, with the inlet side being the "front" side and the outlet side being the "rear" side. However, these terms are meant merely to aid understanding and are not limiting. In particular, in some examples of the pump 100, the supports 144 and 151 could be reversed in orientation, with the support 144 being nearer the outlet 132 and the support 151 being nearer the inlet 131, in which case the terms "front" and "rear" as used herein would be reversed in relation to these components.

The impeller 140 further comprises an adjustment mechanism 148. The adjustment mechanism 148 couples the shaft 143 to the rear support 151. The adjustment mechanism 148 is actuatable, and when actuated changes the position of the shaft 143 relative to the rear support 151, and hence also relative to the impeller chamber 133. More specifically, the adjustment mechanism 148 is configured to cause translation of the shaft 143 relative to the rear support 151 and impeller chamber 133 along the rotation axis 149. Because the shaft 143 is a rigid body and the front support 144 is coupled to the impeller chamber 133, the translation of the shaft 143 relative to the impeller chamber 133 also comprises the front end of the shaft 143 translating relative to the front support 144.

For example, the adjustment mechanism 148 may comprise a set screw (or similar devices, such as a bolt, threaded rod, etc.) that is coupled to the shaft 143 and internal threads coupled to the rear support 151, such that when the set screw is rotated this causes translation of the set screw and hence also the shaft 143 coupled thereto. The internal threads may be integrally formed in the rear support 151 or may be part of a separate component, such as a threaded sleeve or nut, coupled to the rear support 151. In these examples, rotation of the screw may correspond to the aforementioned actuation of the adjustment mechanism 148.

In other examples adjustment mechanism 148 comprises a friction or interference fit between the shaft 143 and the rear support 151 that allows the shaft 143 to translate when sufficient pushing force is applied thereto but which prevents translation of the shaft 143 under normal operational forces. For example, the friction/interference fit may be provided by a retention device such as a push-on retaining ring that engages the shaft 143 and allows for translation of the shaft 143 relative thereto in one direction but which resists or prevents translation of the shaft 143 relative thereto in the opposite direction. Such a retention device may be coupled to the rear support 151 such that the translation of the shaft 143 relative thereto comprises translation of the shaft 143 relative to the conduit 130. The retention device may be oriented to permit translation of the shaft 143 towards the inlet 131 while resisting translation toward the outlet 132. In some examples, friction may be sufficient to prevent motion of the shaft 143 under normal operating conditions, but the shaft 143 may be caused to translate towards the inlet 131 in response to a sufficiently strong pushing force being applied thereto, for example via a tool inserted through the inlet outlet 132. In these examples, pushing the shaft 143 to drive translation thereof may correspond to the aforementioned actuation of the adjustment mechanism 148.

Because the shaft 143 is coupled to the impeller body 145 such that their relative motion is constrained to only rotation about the axis 149, when the shaft 143 is translated along the axis 149 this also causes the impeller body 145 to be translated along the axis 149. Thus, in summary, actuation of the adjustment mechanism 148 causes translation of the impeller body 145 along the axis 149. This may be referred to herein as "adjusting" the position of the impeller 140, and thus the impeller 140 may also be referred to herein as an adjustable impeller 140.

FIGS. 2A and 2B illustrate the effects of adjusting the impeller 140 via the adjustment mechanism 148. In FIG. 2A, the blade tip 142 has a tip clearance of d1, where tip clearance refers to the smallest distance between the blade tip 142 and the sloped wall of the transition zone 135 of the impeller chamber 133. This state may occur, for example, after the pump 100 has been first assembled. Due to the manufacturing tolerances involved, the tip clearance d1 is relatively large, and thus performance of the pump 100 may be degraded. However, by adjusting the position of the impeller 140 towards the inlet 131 (as indicated by the arrow in FIG. 2A), the state shown in FIG. 2B is obtained. In the transition between the state of FIG. 2A and the state of FIG. 2B, the translation of the impeller 140 towards the inlet 1341 causes the blade tip 142 to move closer to the wall of the transition zone 135 due to the slope of the wall. Thus, in the state shown in FIG. 2B, the tip clearance of the blade tip 142 has been reduced to d2, which is less than d1. In this manner, any tip clearance that is desired, including a relatively small tip clearance, can be obtained by adjusting the impeller 140. Moreover, even if individual impellers 140 have varying dimensions due to manufacturing tolerances, each may be adjusted to have similar tip clearances.

In some examples, it can be determined if a desired tip clearance has been obtained by observing and/or measuring the position of the blades 141. For example, in some pumps the blades 141 may be visible through the impeller chamber inlet 134 (particularly if the inlet portion 131 has not yet been installed thereon), and this may allow for observation and/or measurement of the position of the blades 141 relative to the walls of the chamber 133 at the transition zone 135. In some examples, one portion of the conduit 130 and housing 110 may be made from a transparent material and the position of the blades 141 may thus be observed through this portion. In another example, a special port or opening (not illustrated) may be provided through the housing 110 and conduit 130 through which visual observations may be made and/or through which a measurement device may measure the positions of the blades 141—for example a rod depth micrometer may be inserted through the port or opening to engage the blade 141 and determine a position thereof. In examples with such a port, the port or opening may be closed using a plug and/or epoxy once adjustments have been completed.

Figure 3:
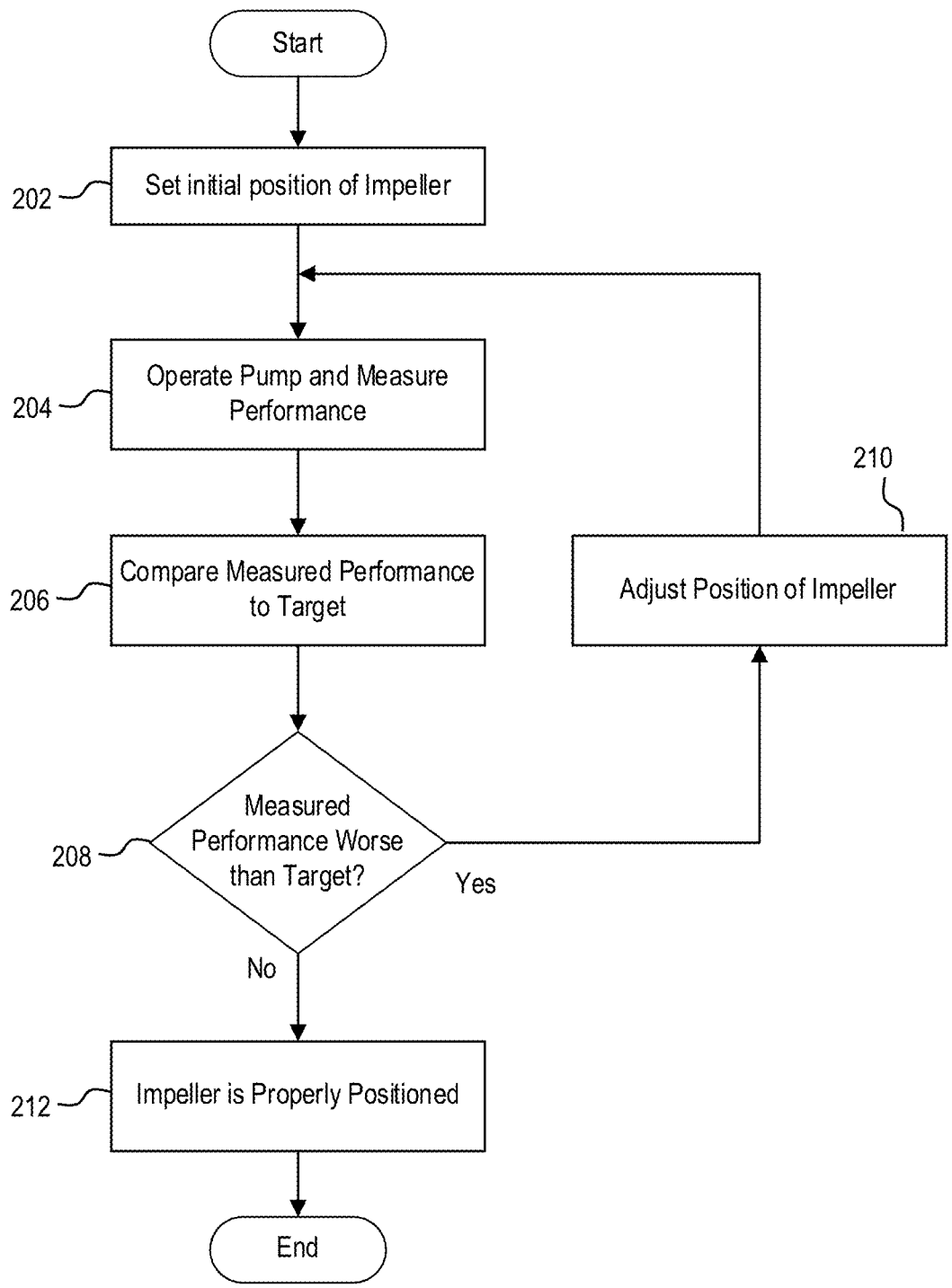
FIG. 3 is a process flow diagram illustrating a method of tuning a pump.

In other examples, directly observing or measuring the position of the blade 141 may be infeasible or otherwise undesirable. In such examples, the impeller 140 may nevertheless be adjusted to a desired position through other approaches, which will be described below with reference to FIG. 3. FIG. 3 illustrates an example method that may be used for adjusting an adjustable impeller of a pump, such as the pump 100 (or the pump 400, described below). The method may also be referred to as a method of tuning a pump, as the adjustment of the impeller affects the performance of the pump and may be used to obtain a desired performance level.

In block 202, an initial position for the impeller may be set. In some cases, this may comprise assembling the pump and placing the impeller in an initial position. In other examples, this may comprise changing the position of the impeller of an already assembled pump. In some examples, block 202 is omitted and the process may proceed with the impeller starting in an arbitrary position (e.g., whatever position the impeller happens to be in after assembly). In examples in which the initial position of the pump is adjusted to a predetermined position, the predetermined position may be defined in any manner that is desired. For example, in some implementations the initial position may be a position corresponding to predetermined number of turns of the adjustment mechanism away from a fully forward position in which the blades of the impeller are touching the walls of the impeller chamber. That is, the impeller may be adjusted until it touches the impeller chamber, which will be noticed as the adjustment mechanism encounters resistance, and then may be backed off from that position a predetermined number of turns of the adjustment mechanism. This position may reduce the amount of time spent on hunting for its ultimate position, as the impeller may start out closer to its target location (which is relatively close to the wall). As another example, in some implementations the initial position may be a fully rearward position. This may require more time to be spent on testing, in some cases, but may avoid a risk of damage to the blades resulting from contact with the walls. In other examples, other initial positions may be used.

Blocks 204, 206, 208, and 210 form a loop, which is referred to herein as a tuning cycle. The tuning cycle may be repeated iteratively until a NO result is achieved in block 208.

In block 204, the pump is coupled to a liquid loop and operated to flow liquid, and the performance of the pump is tested. Specifically, at least one pump performance metric is measured. Any desired metric that has a relation to the performance of the pump and is affected by the tip clearance can be used in this step. Examples of pump performance metrics that are affected by tip clearance include the pressure differential generated by the pump between an inlet and an outlet (higher is better), also referred to as the head or head differential, and the flow rate of the pump (volume of liquid per unit time) (higher is better). In some examples, the pressure differential and flow rate may both be measured and may be used together. For example, the pressure differential of a given pump may vary depending on the flow rate, and thus both may be measured. For example, in some implementations the metric may comprise the pressure differential at a predetermined flow rate. Additional examples of pump performance metrics contemplated herein include power consumption at a given flow rate and pressure, power consumption and/or impeller rotational speed needed to achieve a desired flow rate, pressure and/or flow rate achieved at a given rotational speed of the impeller and/or power consumption, vibration, and noise.

In block 206, the measured pump performance may be compared to one or more target pump performance metrics. The target pump performance metrics may have been determined in advance for the given type of pump being tested. For example, the target may be determined by measuring performance of a pump that is known to have desired characteristics including a desired blade tip clearance. Alternatively, the target pump performance metrics may be determined based on modeling or other empirical testing that correlates blade tip clearance to performance.

In block 208, it is determined, based on the comparison in block 206, if the measured performance of the pump is worse than the target performance. In other words, it is determined if the measured performance satisfies a target criterion, wherein the target criterion relates measured pump performance to the target performance and satisfying the target criterion means the pump performance is not worse than the target performance.

For some performance metrics, a lower value is the worse or less desirable value. Thus, when such performance metrics are used, then the measured performance may be determined to satisfy the target criterion (i.e., to not be worse than the target) when the measured performance metric is greater than the target value. Conversely, the measured performance may be determined to not satisfy the target criterion (i.e., to be worse than the target) when the measured performance metric is less than the target value. (The case of the measured performance equaling the target may be counted as satisfying the criterion in some examples and as not satisfying the criterion in other examples.) Examples of performance metrics for which lower values are worse include the flow rate of the pump (e.g., gallons per minute), pressure differential generated between pump inlet and outlet, pump efficiency (e.g., flow rate per Watt of power consumption), and pressure and/or flow rate achieved at a given rotational speed of the impeller and/or power consumption. In particular, in some examples, the metric considered in block 208 may be the measured pressure differential at a predetermined flow rate (e.g., 2.0 Gallons per minute), in which case a lower value is a worse value.

For other performance metrics, a higher value is the worse or less desirable value. Thus, when such performance metrics are used, then the measured performance may be determined to satisfy the target criterion (i.e., to not be worse than the target) when the measured performance metric is lower than the target value. Conversely, the measured performance may be determined to not satisfy the target criterion (i.e., to be worse than the target) when the measured performance is less than the target value. The case of the measured performance equaling the target may be counted as satisfying the criterion in some examples and as not satisfying the criterion in other examples. Examples of performance metrics for which higher values are worse include the amount of time needed for the pump to empty a volume of fluid, power consumption at a given flow rate and pressure, power consumption and/or impeller rotational speed needed to achieve a desired flow rate, an amount of vibration, and an amount of noise.

If the performance is worse than the target metric (target criterion is not satisfied) (Block 208=YES), then the tip clearance is not yet at a desired amount, which means that the tip is too far from the wall of the impeller chamber. Thus, in this case the process proceeds to block 210 and the position of the impeller is adjusted. In particular, the position of the impeller is adjusted to bring it closer to the inlet side, and thus closer to the wall of the impeller chamber. Adjusting the position of the impeller in block 210 may comprise, for example, inserting a tool into the pump to adjust the adjustment mechanism thereof. For example, in implementations in which the adjustment mechanism comprises a set screw, a screw driver or hex wrench or other such tool may be inserted into the pump (e.g., via the outlet opening, in some examples) to turn the set screw.

In some examples, the position of the impeller may be adjusted by a predetermined amount, such as one quarter turn of a set screw of the adjustment mechanism, for example. The goal with using predetermine adjustment amounts is to avoid over adjusting the impeller and thus running the blades into the wall of the chamber. The desired blade tip clearance can be very small—on the order of a few thousandths of an inch in some examples—and thus in some examples the predetermined adjustment amount may also be relatively small to reduce the chance of adjusting the impeller past the optimal location and into the chamber wall.

In some examples, the predetermined adjustment amount is fixed and invariant from one iteration of the tuning cycle to the next. In other some examples, the predetermined amount by which the impeller is adjusted may change from one tuning cycle to the next. For example, in some implementations the adjustment amount may be determined dynamically in each iteration of the tuning cycle based on the current performance delta for that cycle (i.e., the difference between the measured performance and the target performance). For example, a predetermined table or formula may be prepared in advance which relates various performance deltas to corresponding allowable adjustment amounts, and this table or formula may be consulted based on the current performance delta to determine an adjustment amount for the current iteration of the cycle. Using predetermined adjustment amounts that vary based on the current performance delta may allow for larger adjustments to be made when the difference is large, on the assumption that a larger difference means the impeller is relative far out of position and thus a larger adjustment may be safer. Then, as the impeller gets closer to the correct position the differences will get smaller and the adjustment amounts may correspondingly get smaller to reduce the risk of overshooting the target position.

Once the position of the impeller has been adjusted in block 210, the process loops back to block 204, and a new iteration through steps 204-208 is performed. This loop through blocks 204-210 may be repeated over and over again, with the impeller being progressively adjusted with each iteration of the loop, until in block 208 it is determined that the measured performance is not worse than the target performance, whereupon the loop ceases, and the process continues to block 212.

When the measured performance is equal to or greater than the target performance (target criterion is satisfied) (BLOCK 208=NO), this means that the blade tip clearance has reached the desired value. Thus, in block 212 it is determined that the impeller is properly positioned relative to the impeller chamber, and thus further adjustments thereof are no longer needed.

In some examples, the adjustment mechanism may be designed to securely hold the impeller in place without further aid once adjustments are complete—that is, the friction between the set screw and sleeve/nut may be sufficient to resist backing out under normal operating conditions. For example, in some implementations the set screw or threaded sleeve/nut may comprise integral locking features that increase the friction between screw and sleeve to aid in resisting unscrewing, such as a compliant material that increases friction (such as the nylon in a nylon lock nut).

In other examples, to even further reduce the risk that vibrations or other forces could eventually cause the set screw and sleeve/nut to move, a separate securing mechanism may be used to further secure the impeller in the desired position. For example, an additional mechanical lock separate from the screw and sleeve/nut may be coupled to one of these to aid in securing the shaft in its proper place. For example, a locking nut, a jamb nut, or other such fastener may be attached to the screw and/or sleeve after adjustment has been completed to resist movement thereof. In other examples, instead of securing the set screw and sleeve/nut relative to one another, the shaft may be secured relative to one of the support structures that holds in. For example, the front support structure may comprise a retention screw that is arranged to translate radially in the front support structure when actuated and to thus engage the radially outer surface of the front portion of the shaft of the impeller when tightened. In such an example, the retention screw may be loosened during adjustment of the impeller to allow translation of the shaft relative to the supports and then the retention screw may be tightened after adjustment is complete to secure the shaft to the front support. Other types of retention mechanisms could be coupled to the front or rear supports to engage the shaft and hold it in place, as would be familiar to one of ordinary skill in the art.

In other examples, a chemical thread locker may be used to secure the adjustment mechanism, and hence the shaft, in place. A chemical thread locker comprises a compound designed to be disposed between the screw and sleeve/nut and to cure over time to secure the threaded components relative to one another. The chemical thread locker may, for example, be applied to the threads of the adjustment mechanism during assembly thereof, then the testing and adjustment may be performed while the thread locker has not yet cured, and then after the adjustment is complete the thread locker may eventually cure and thus lock the impeller in its proper position. In other examples, the chemical thread locker may be applied after the adjustment is complete (e.g., in this case, the thread locker might not cover all the threads, but in some cases securing the exposed portions of the set screw and sleeve/nut may be sufficient).

Turning now to FIGS. 4-13, another example pump will be described, in the form of pump 400. The pump 400 is an example configuration of the pump 100 described above. Thus, some components of the pump 400 are similar to (e.g., example configurations of) corresponding components already described above, and thus the descriptions of the components of the pump 100 above are applicable to the similar components of the pump 400, and duplicative descriptions of certain aspects of the pump 400 may thus be omitted. Corresponding components may be referred to using reference numbers having the same last two digits, such as 110 and 410. It should be understood that the pump 400 is but one possible configuration of the pump 100, and the pump 100 is not limited to the pump 400. Similarly, the individual components of the pump 400 are examples of the corresponding individual components of the pump 100, but the individual components of the pump 100 are not limited to the corresponding components of the pump 400.

Figure 15:
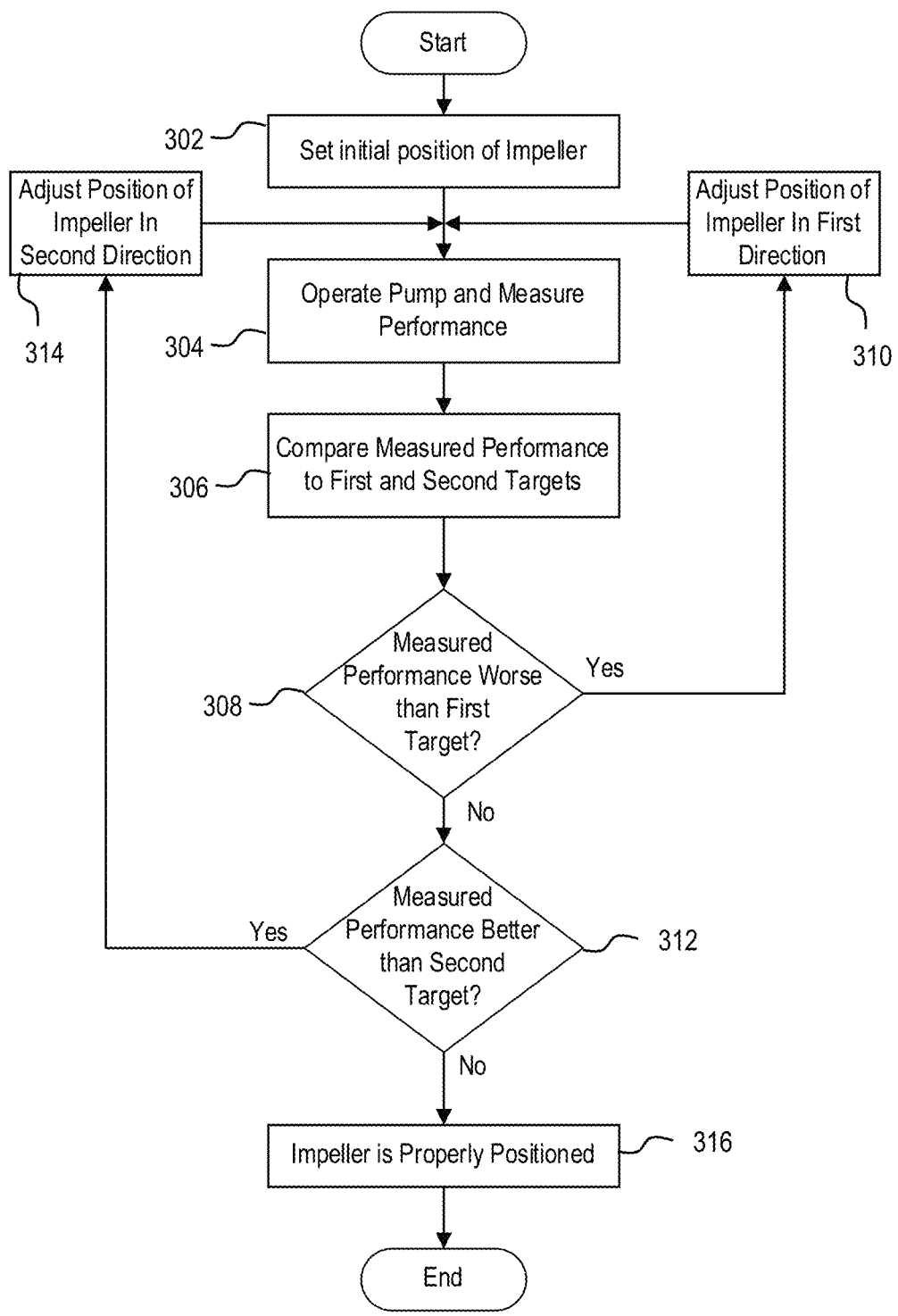
FIG. 15 is a process flow diagram illustrating a method of tuning a pump.

FIG. 15 illustrates another example method that may be used for adjusting an adjustable impeller of a pump, such as the pump 100 (or the pump 400, described below). The method of FIG. 15 is a modified version of the method of FIG. 3. The method may also be referred to as a method of tuning a pump, as the adjustment of the impeller affects the performance of the pump and may be used to obtain a desired performance level. This method may be particularly useful, for example, in circumstances in which it is desired to position the blade tips close enough to the wall to produce a desired level of performance but not so close to the wall as to risk other issues, such as tip strikes or reduced reliability (as opposed to positioning the tip of the blade as close as possible to the wall, which may produce better performance but could risk reduced reliability of the pump).

In Blocks 302 and 304 the initial position of the impeller is set, the pump is operated, and measurements of pump performance metrics are made. Blocks 302 and 304 may be similar to blocks 202 and 304 described above in relation to FIG. 3, and thus duplicative description thereof is omitted.

In Block 306, the measured performance metrics are compared to first and second targets. The first target may be a lower target and the second target may be an upper target.

In block 308 it is determined if the measured performance is worse than the first target. The performance being worse the second target may indicate that the tip is farther from the impeller chamber wall than is desired. Thus, if the performance is worse than the second target, then the process continues to block 310, in which the position of the impeller is adjusted in a first direction, e.g., towards the inlet, such that the blade tip moves closer to the impeller wall. The process then returns to block 304 to perform another iteration of the tuning cycle 304-314. If the performance is not worse than the second target, then the process continues to block 312.

In block 312, it is determined if the measured performance is better than the second target. The performance being better than the second target may indicate that the tip is closer to the impeller chamber wall than is desired. Thus, if the performance exceeds the second target, then the process continues to block 314, in which the position of the impeller is adjusted in a second direction, e.g., towards the outlet, which may move the tip further from the wall. The process then returns to block 304 to perform another iteration of the tuning cycle 304-314. If the performance is not better than the second target, then the process continues to block 316, in which the impeller is determined to be properly positioned.

Figure 4:
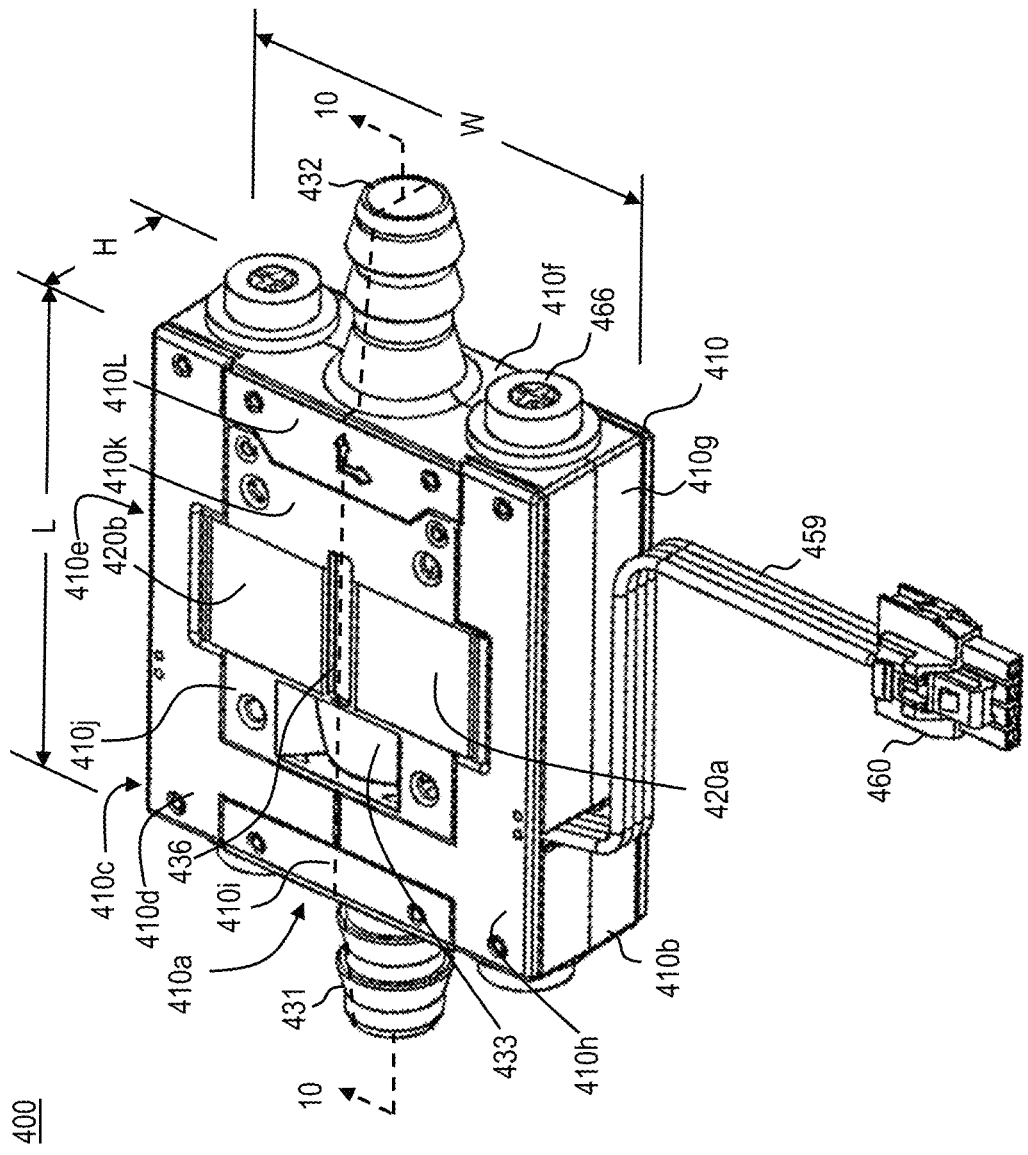
FIG. 4 is a perspective view of another pump.
Figure 5:
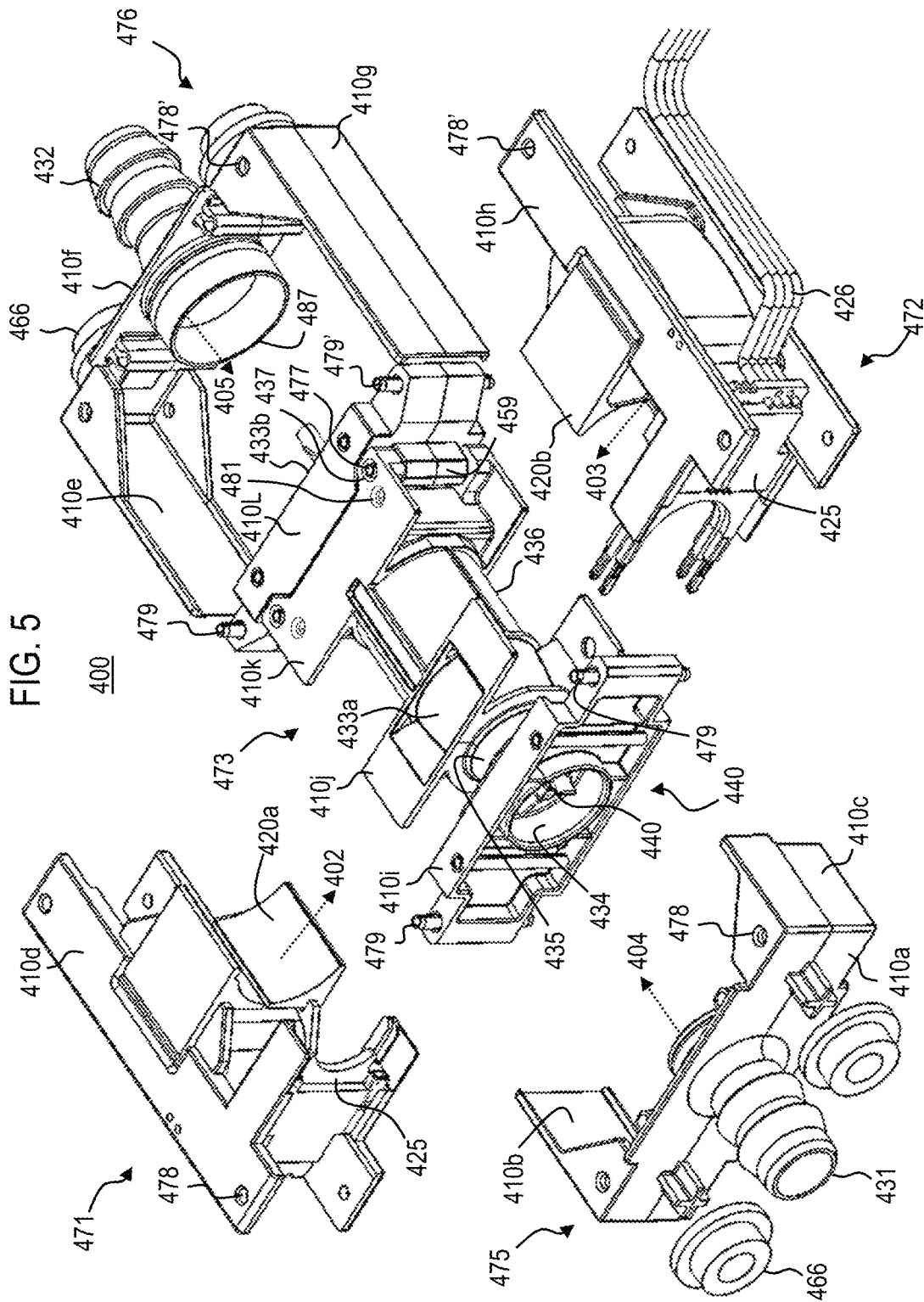
FIG. 5 is an exploded view of the pump of FIG. 4.
Figure 6:
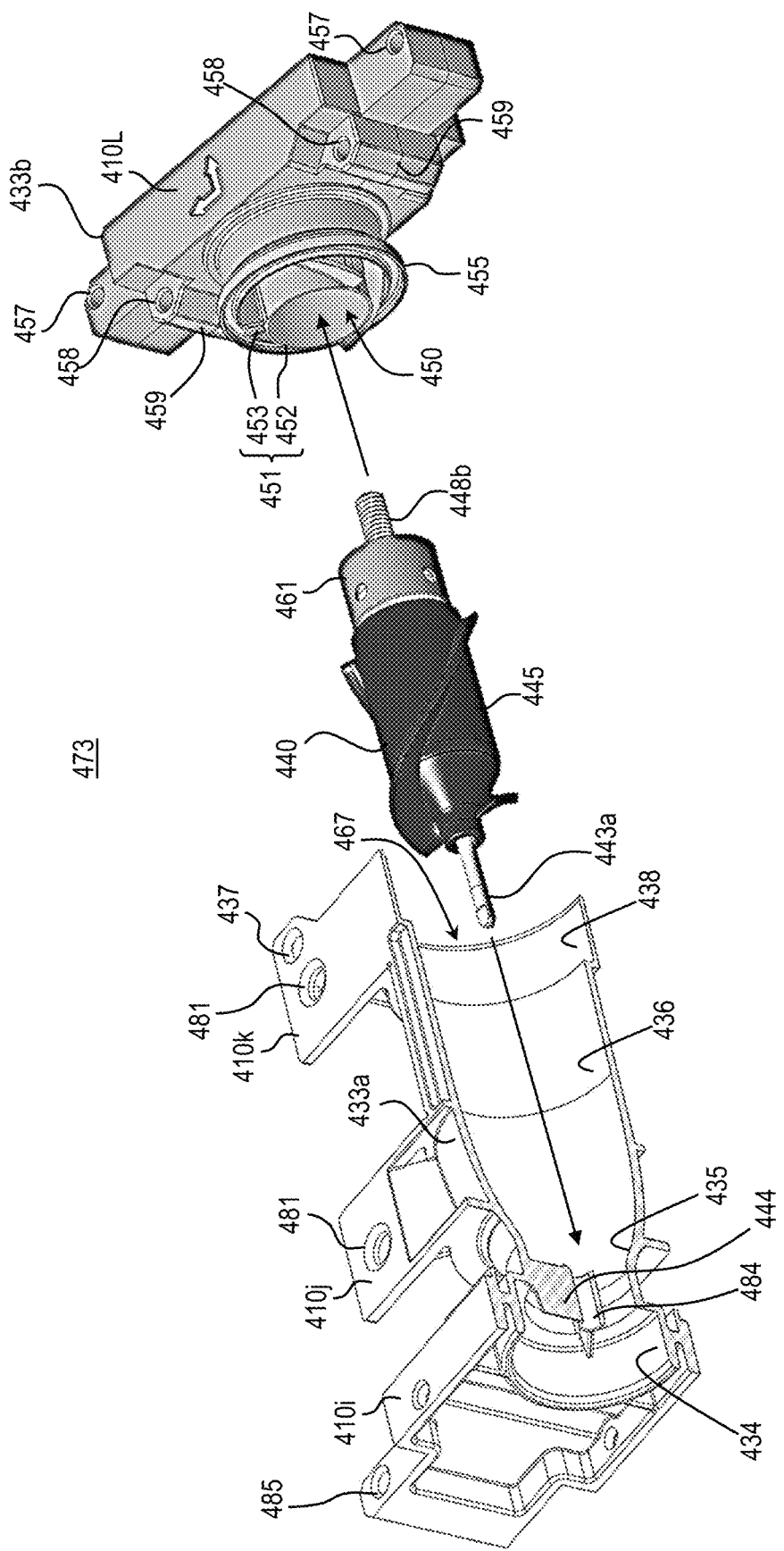
FIG. 6 is an exploded perspective view of an impeller subassembly of the pump of FIG. 4, including a perspective sectional view of a portion of the impeller subassembly with the section taken along the plane 10-10 in FIG. 4.
Figure 7:
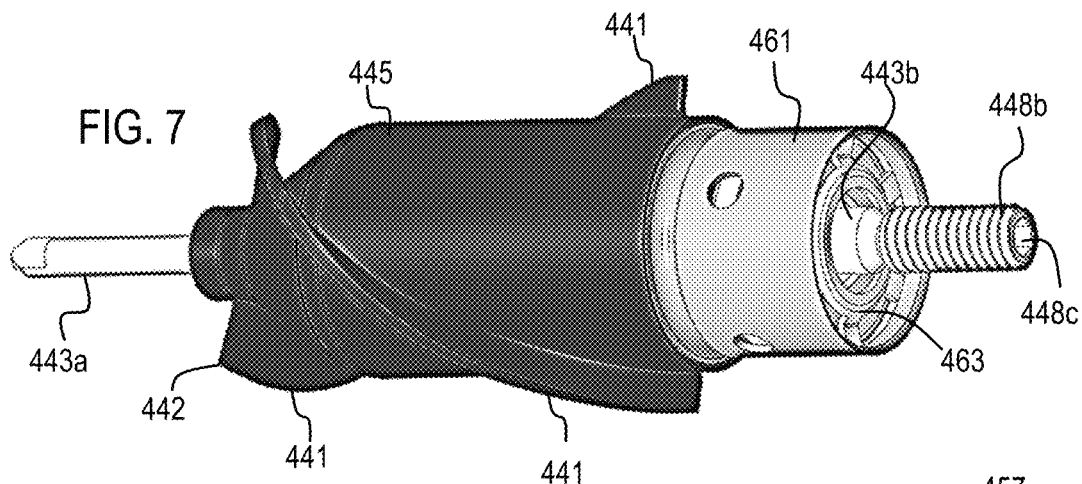
FIG. 7 is a perspective view of an impeller of the pump of FIG. 4.
Figure 8:
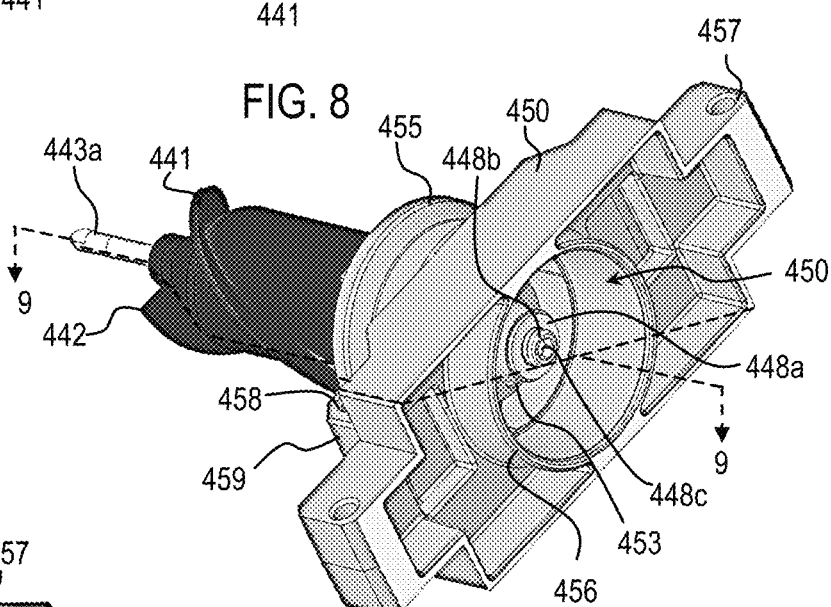
FIG. 8 is a perspective view of the impeller and an impeller chamber rear portion of the pump of FIG. 4.
Figure 9:
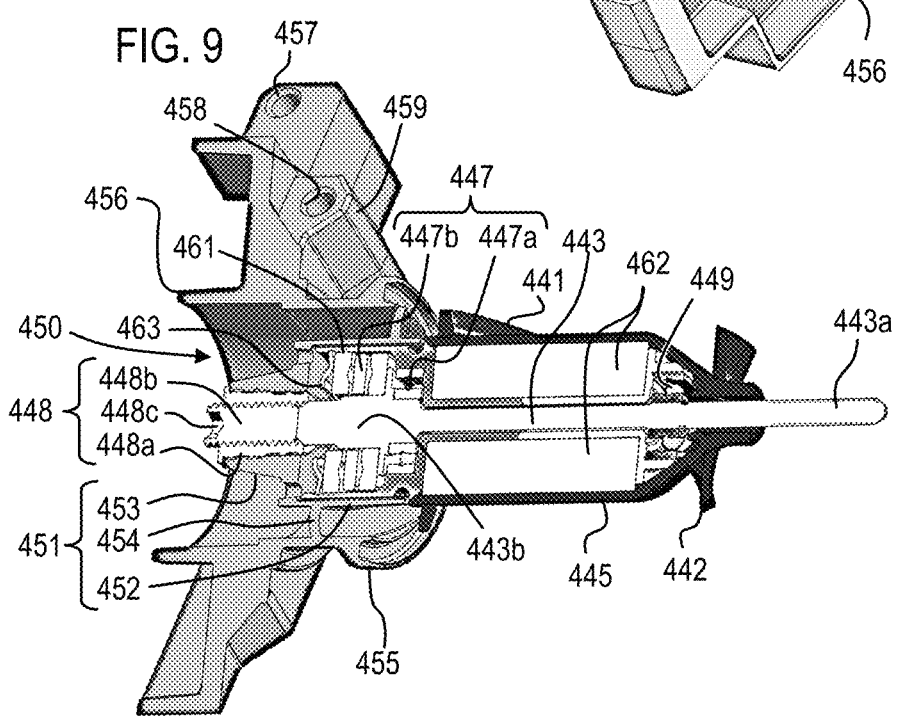
FIG. 9 is perspective sectional view of the impeller and impeller chamber rear portion of FIG. 8 with the section taken along the plane 9-9 in FIG. 8.

Various aspects of the pump 400 are visible in multiple figures, and different figures may show certain aspects better than others. Thus, rather than describing each of FIGS. 4-13 below in strict sequence, the various aspects of the pump 400 will be described in turn below with reference to some of the figures that are most relevant to the particular aspect under discussion. FIGS. 4 and 5 show the pump 400 in perspective and exploded views, respectively; FIG. 6 shows an exploded view of an impeller subassembly 473 of the pump 400; FIG. 7 shows an impeller 440 of the pump 400 in perspective view; FIG. 8 shows the impeller 440 and an impeller chamber rear portion 433b of the pump 400 in perspective view; FIG. 9 comprises a cross-section of the impeller 440 and impeller chamber rear portion 433b taken along the plane 9-9 in FIG. 8; FIG. 10 comprises a cross-section of pump 400 taken along the plane 10-10 in FIG. 4; FIGS. 11 and 12 comprise enlarged views of the regions 11 and 12, respectively, in FIG. 10; and FIG. 13 comprises a perspective sectional view of the pump with the section taken along the plane 10-10 in FIG. 4.

As shown in FIG. 5, the pump 400 comprises a number of subassemblies, including a first stator subassembly 471, a second stator subassembly 472, an impeller subassembly 473, an inlet subassembly 475, and an outlet subassembly 476. Each of these subassemblies will be described in greater detail below.

As shown in FIGS. 5 and 6, the first and second stator subassemblies 471 and 472 comprise first and second stator portions 420a and 420b, respectively. In addition, the first and second stator subassemblies 471 and 472 comprise the PCBs 425, which make up a split PCA, such as the split PCA described in the U.S. patent application Ser. No. 17/976,406 entitled "AXIAL PUMP WITH SPLIT PRINTED CIRCUIT BOARD ASSEMBLY (PCA)" and filed on Oct. 28, 2022, the entire contents of which is incorporated herein by reference. The PCBs 425 are electrically coupled, for example via solder or other electrical connections to the first and second stator portions 420a and 420b, respectively. As shown in FIG. 5, the first and second stator subassemblies 471 and 472 are positioned on opposite lateral sides of the impeller subassembly 473. Thus, during assembly of the pump 400 the first and second stator subassemblies 471 and 472 may be positioned as shown in the exploded view of FIG. 5 and then the stator subassemblies 471 and 472 may be moved laterally (along directions indicated by arrows 402 and 403) to bring the stator subassemblies 471 and 472 together around the impeller subassembly 473. Once so assembled, the stator portions 420a and 420b are positioned adjacent to and radially surround the impeller chamber central portion 436 (except for small regions at the top and bottom of the central portion 436, which are not surrounded). Moreover, as the first and second stator subassemblies 471 are coupled to the impeller subassembly 473, the PCBs 425 become electrically coupled.

As shown in FIGS. 5 and 6, the impeller subassembly 473 comprises an impeller chamber 433 and an impeller 440 housed within the impeller chamber 433. The impeller chamber 433 comprises a front portion 433a and a rear portion 433b. The impeller chamber front portion 433a comprises a bore 467 and the rear portion 433b comprises a bore 450. As suggested by the arrows in FIG. 6 when the impeller subassembly 473 is assembled the front portion 433a and rear portion 444b are coupled together with the impeller 440 positioned partially inside the bore 467 and partially inside the bore 450. As shown in FIGS. 5 and 6, the impeller chamber front portion 433a comprises an impeller chamber inlet 434, a transition zone 435, an impeller chamber central portion 436, and an engagement portion 438. These portions encircle and define the bore 467. As shown in FIG. 6, the impeller chamber rear portion 433b comprises an engagement portion 455 configured to engage with (e.g., be received within) the engagement portion 438 of the front portion 433a to couple the front portion 433a and rear portion 433b together. The engagement portion 455 encircles and defines the bore 450.

As shown in FIGS. 7 and 9, the impeller 440 comprises an impeller body 445, blades 441 protruding radially from the impeller body 445 and spiraling axially and circumferentially along and around the outer surface of impeller body 445, a shaft 443 comprising a front end 443a and a rear end 443b, a bearing housing 461, bearings 447 contained within the bearing housing 461 and coupled to the rear end 443b of the shaft 443, bearings 449 contained within the impeller body 445 and coupled to the shaft 443, and magnets 462 contained within the impeller body 445. The bearings 447 and 449 rotatably couple the impeller body 445 to the shaft 443, thus enabling the impeller body 445 to rotate relative to the shaft 443 around an axis 439 (see FIG. 10). The shaft 443 is coupled to the impeller chamber 433, as will be described below, and thus as the impeller body 445 rotates about the shaft 443 it also rotates relative to the impeller chamber 433. The magnets 462 interact with magnetic fields created by the stator 420 and this causes rotation of the impeller body 445.

Figure 13:
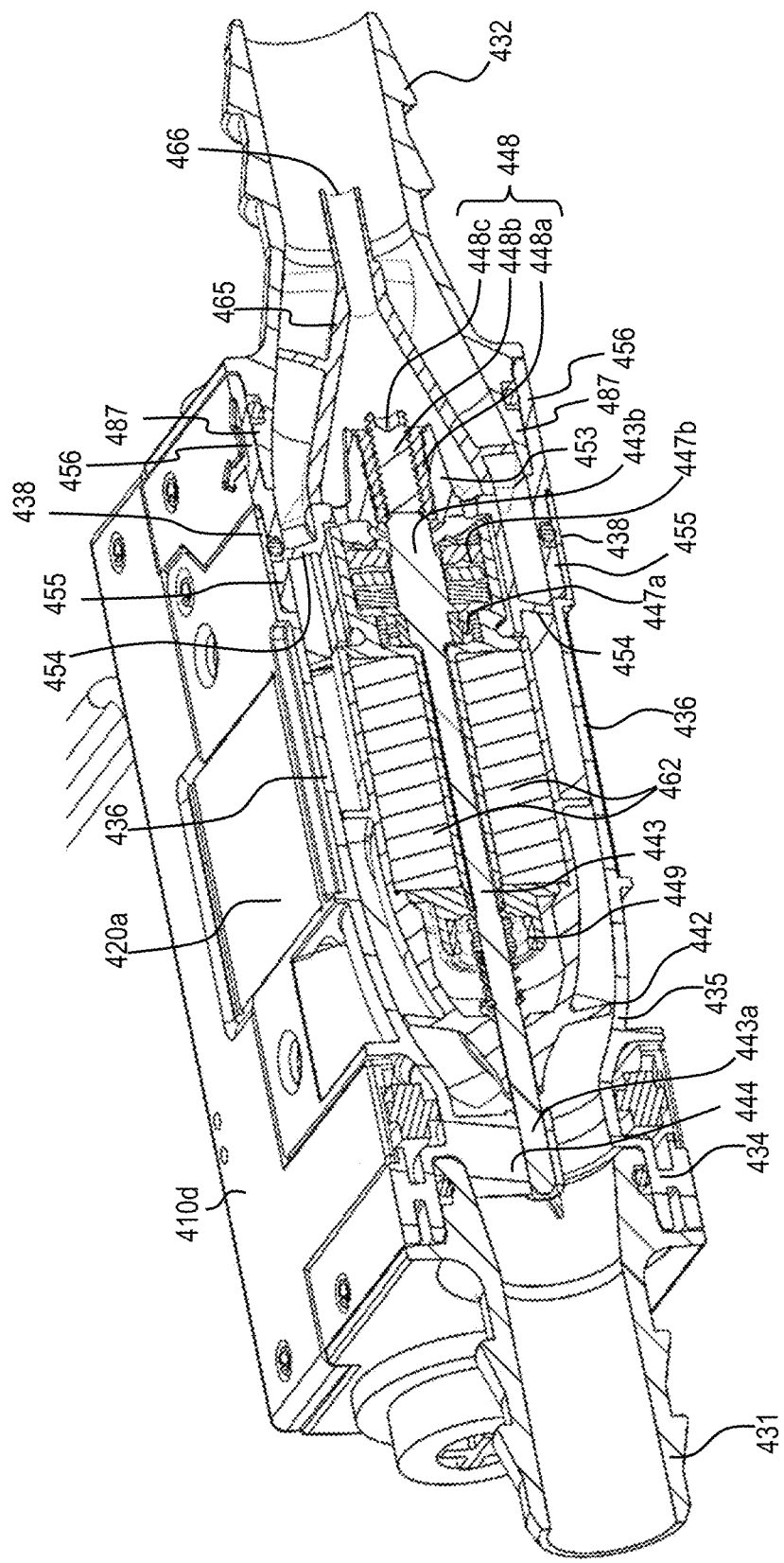
FIG. 13 is a perspective sectional view of the pump of FIG. 4 with the section taken along the plane 10-10 in FIG. 4.

As shown in FIGS. 6, 10, and 13, when the subassembly 473 is assembled, the impeller 440 is contained within the impeller chamber 433, with a front end thereof coupled to the front portion 433a of the impeller chamber 433 and a rear end thereof coupled to the rear portion 433b of the impeller chamber 433. More specifically, a front end 443a of the shaft 443 of the impeller 440 is inserted into a hub 484 in a front support 444, as shown FIGS. 10 and 13. The front support 444 is coupled to the walls of the impeller chamber 433 at a location between the inlet portion 434 and the transition zone 435. Thus, when the front end 443a is engaged by the front support 444, the front support 444 supports the shaft 443 relative to the impeller chamber 433. Similarly, the rear end 443b of the shaft 443 is inserted into and engaged by a rear support 451 of the rear portion 433b of the impeller chamber, as shown in FIGS. 9, 10, 12, and 13. In particular, an adjustment mechanism 448 is coupled to the rear support 451, as shown in FIGS. 9 and 12, and the rear end 443b of the shaft 443 is coupled to this adjustment mechanism 448. Furthermore, as shown in FIGS. 9 and 12, the bearings 447 and 449 that couple the impeller body 445 to the shaft 443 comprise a set of radial bearings 447a coupled to the rear portion 443b of the shaft and a set of radial bearings 449 coupled to the shaft between the front end 443a and the rear portion 443b (but closer to the front end 443a). These radial bearings 447a and 449 allow for the smooth and easy rotation of the impeller body 445 relative to and around the shaft 443. The bearings 447 also comprise thrust bearings 447b. The thrust bearings 447b engage a flange of the shaft 443 on one side and a retainer 463 on an opposite side, as shown in FIG. 9, to absorb axial thrust forces and prevent translation of the impeller body 445 relative to the shaft 443.

The rear support 451 and the adjustment mechanism 448 will now be described in greater detail with reference to FIGS. 7-13. The rear support 451 comprises a cylinder 452 disposed within the bore 450, a nut holding portion 453 coupled to one end of the cylinder 452, and attachment portions 454 that extend radially from the cylinder 452 to couple the cylinder 452 to the engagement portion 455. Although not visible in the figures, the attachment portions 454 are arranged so as to not block the flow of liquid through the chamber 433, with the liquid flowing through the space between the engagement portion 455 and the cylinder 452 and around the attachment portions 454. The nut holding portion 453 is coupled to a nut 448a of the adjustment mechanism 448. The nut 448a has a bore and internal threads in the bore configured to engage external threads of a set screw 448b of the adjustment mechanism 448 inserted therein. This engagement may also be referred to therein as "threading" engagement or "threadingly" engaging. The set screw 448b has a socket 448c to receive a tool to allow actuation (i.e., rotation) of the set screw 448b. The set screw 448b is coupled to the rear end 443b of the shaft 443. Thus, the rear end 443b of the shaft 443 is coupled to and supported by the engagement portion 455 of the rear portion 433b via the rear support 451. Because the rear portion 443b of the shaft 443 is coupled to the impeller chamber rear portion 433b and the front portion 433a of the shaft 443 is coupled to the impeller chamber front portion 433a, when the front portion 433a and rear portion 433b are assembled, the shaft 443 is fixedly coupled to and supported by the impeller chamber 433.

The adjustment mechanism 448 described above is adjustable to change a position of the shaft 443 relative to the impeller chamber 433. If the sets screw 448b is rotated, this causes the set screw 448b, to translate relative to the nut 448a along rotation axis 439. Because the set screw 448b is coupled to the shaft 443 and the nut 448a is coupled to the impeller chamber 433 (via rear support 451), the aforementioned relative translation between the set screw 448b and nut 444a causes the shaft 443 to translate relative to the impeller chamber 433 along the rotation axis 439. Rotating the set screw 448b in one direction causes translation of the shaft 443 towards the inlet 431, while rotating the set screw 448b in the opposite direction causes translation of the shaft 443 away from the inlet 431. Rotation of the set screw 448b thus represents one implementation of actuation of the adjustment mechanism 448. As described above in relation to the pump 100, the adjustment mechanism 448 may be adjusted after assembly of the pump 400 to change the position of the impeller 440 and thereby adjust the blade tip clearance between the blade tip 442 and the sloped wall of the transition zone 435, as best seen in FIG. 11. The actuation may be accomplished by inserting a tool, such as a hex driver or screw driver, through the outlet 432, through an opening 468 in a flow guide 465, and into the socket 448c of the adjustment mechanism 448.

The impeller chamber 433 is also coupled to various support structures and/or comprises various surfaces that form part of the housing 410 and which facilitate joining of the other subassemblies together. For example, as shown in FIG. 6, the rear portion 433b comprises fastener holders 459 with holes 458 to receive fasteners 477. As shown in FIGS. 5 and 6 the front portion 433a comprises holes 437, and when the front portion 433a and rear portion 433b are coupled together the holes 437 align with the holes 458. Thus, as shown in FIG. 5 a fastener 477 is inserted through the holes 437 and 458 to secures the front portion 433a and rear portion 433b in the coupled state. In addition, as shown in FIG. 6, the rear portion 433b also comprises holes 457, which receive fasteners 479, as shown in FIG. 5. Similarly, the front portion 433a comprises holes 485 to receive fasteners 479, as shown in FIGS. 5 and 6. These fasteners 479 are used to coupled the various subassemblies together, as will be described below. In some examples, the front portion 433a may also comprise holes 481, which may be used to fill the pump 400 with epoxy after assembly to make the pump 400 water resistant and also to aid with transfer of heat from pump 400 components into the coolant by removing air gaps. Furthermore, the impeller chamber 433 is coupled to housing portions 410i, 410j, 410k, and 410L.

The inlet subassembly 475 comprises the inlet 431 and vibration isolators 466. The outlet subassembly 476 comprises the outlet 432 and vibration isolators 466. In the illustrated example, the inlet 431 and outlet 432 comprise hose barb couplings. In other examples, other types of liquid couplings may be substituted for the hose barb couplings. The pump 400 may be coupled to another device (e.g., a chassis of a computing device that the pump 400 is disposed within) via the vibration isolators. The vibration isolators 466 may be rubber, silicon, or another compliant material that helps to absorb vibrations generated by the pump 400 and prevent (or reduce) the transmission of these vibrations to the device in which the pump 400 is disposed. As shown in FIG. 6, the outlet 432 comprises an engagement portion 487. This engagement portion 487 is configured to engage with an engagement portion 456 of the impeller chamber rear portion 433b. The engagement portion 456 is best seen in FIGS. 8 and 9, and the engagement between the engagement portions 487 and 456 is illustrated in FIGS. 10, 12, and 13. As shown in FIGS. 10, 12, and 13, the outlet 432 may also comprise a flow guide structure 465, which guides the flows of liquid as they exit the impeller chamber 433 and enter the outlet 432. This may help to reduce turbulence or eddies that may impair pump performance.

In addition, each of the inlet and outlet subassemblies 475 and 476 comprises portions of the housing 410. As shown in FIG. 5, the inlet and outlet subassemblies 475 and 476 may be positioned on opposite axial sides of the impeller subassembly 473. Thus, during assembly of the pump 400 the inlet and outlet subassemblies 475 and 476 may be positioned as shown in FIG. 5 and then moved towards one another (along directions indicated by arrows 404 and 405) until the inlet 431 is fluidically coupled with one side of the impeller chamber 433 and the outlet 432 is fluidically coupled with the other side of the impeller chamber 433. In some examples, this assembly step may occur after the two stator subassemblies 471 and 472 have been assembled onto the impeller subassembly 473. Once the inlet 431, outlet 432, and impeller chamber 433 are coupled together, they form the conduit 430 through which liquid coolant may flow along a central axis 439 thereof.

As shown in FIGS. 4 and 5, the pump 400 comprises a housing 410. This housing 410 may be made up of multiple portions that are joined together. Specifically, the subassemblies described above may comprise these portions of the housing 410. In particular, the housing 410 comprises inlet end wall portion 410a and lateral wall portions 410b and 410c coupled to inlet end wall portion 410a. These portions 410a-c are part of the inlet subassembly 475. The housing 410 further comprises outlet end wall portion 410f and lateral wall portions 410g and 410e. These portions 410e-g are part of the outlet subassembly 475. When assembled, the aforementioned portions 410a-c and 410e-g define the perimeter side walls of the housing 410. The housing 410 also comprises top portion 410d which is coupled to the first stator portion 420a and part of the first stator subassembly 471, and top portion 410h which is coupled to the second stator portion 420b and part of the second stator subassembly 472. The housing also comprises top housing portions 410i, 410j, 410k, and 410L which are coupled to the conduit 430 and are part of the impeller subassembly 473. The top portions 410d, 410h, and 410i-410L form the top face of the housing 410. Note that the top face of the housing 410 is not necessarily uniform and does not necessarily fully cover all of the pump 400. For example, a top of the stator portion 420a and 420b may be exposed and approximately coplanar with the top face of the housing 410 (this may allow the height dimension of the pump 400 to be reduced to the absolute minimum possible for a given size of stator 420). Some of the housing portions may include holes 478 (only some are labeled) that are arranged to receive a fastener 479 to couple the subassemblies together. For example, in some implementations including the one illustrated in FIG. 5, the impeller subassembly 473 comprises fasteners 479 in the form or pins, such as spring-biased push pins, and each of these may be inserted into holes 478 of one more the subassemblies to secure the respective subassemblies together. A single fastener 479 may be inserted through two holes 478 of two different subassemblies—for example, the fastener labeled 479' in FIG. 5 may be inserted into the two holes labeled 478' which are part of the stator subassembly 472 and the outlet subassembly 476. The other fasteners 479 and holes 478 may be similarly joined.

The bottom portion of the housing 410 (which is generally not visible in the figures and is not labeled herein) may be similarly constructed as the top portion thereof, and thus duplicative description of these portions is omitted.

Figure 14:
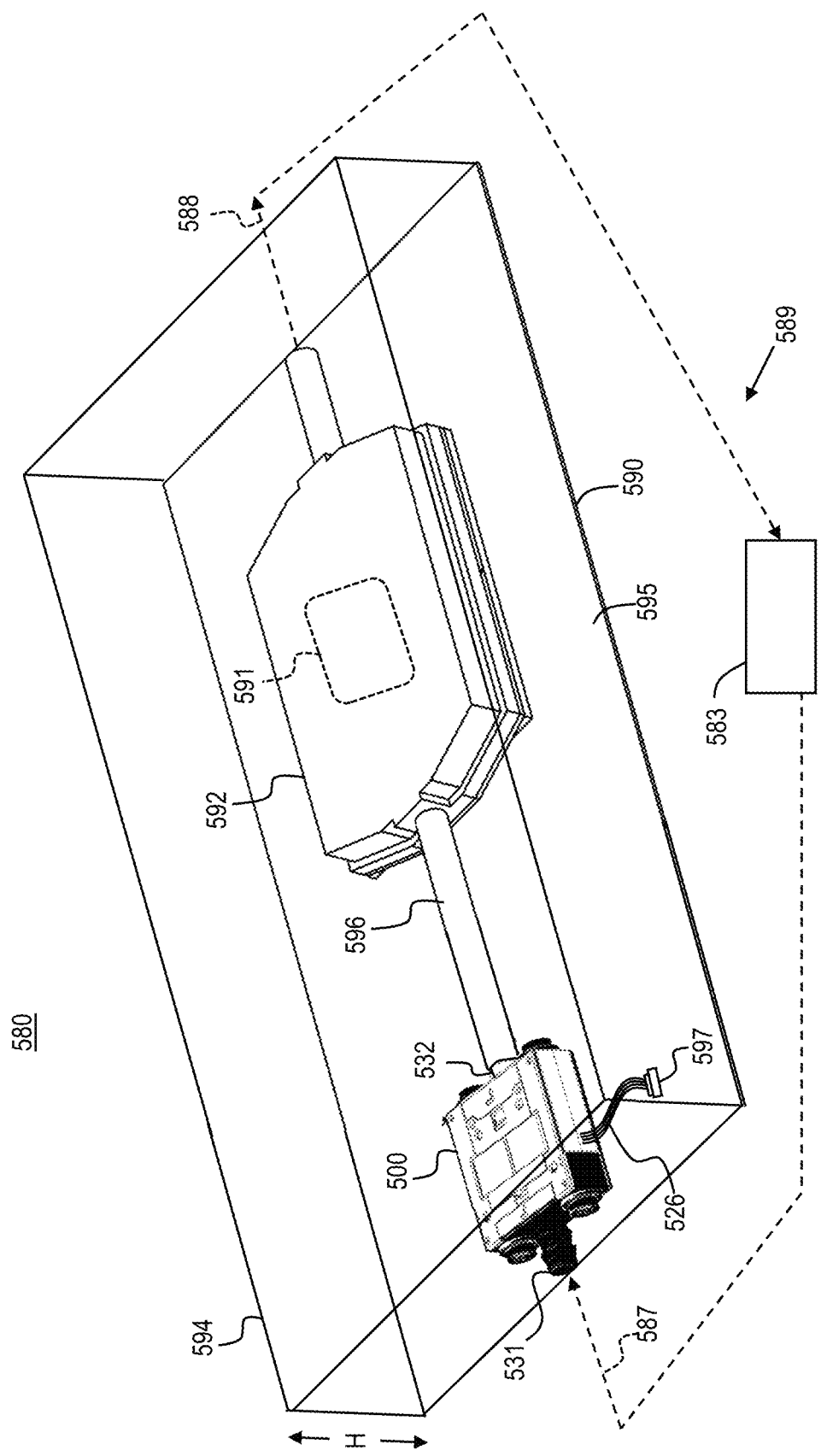
FIG. 14 is a perspective schematic diagram of a system and electronic device comprising a pump.

FIG. 14 comprises a schematic diagram illustrating an example system 580 and electronic device 590. The system 580 comprises the electronic device 590 and a liquid cooling loop 589 coupled to the electronic device 590. The system may also comprise additional electronic devices (not illustrated). For example the system 580 may comprise a rack or plurality of racks of electronic devices. The electronic device 590 is illustrated in a state of being installed in the system 580 for convenience of description, but it should be understood that the electronic device 590 may be provided separate from the system 580.

The liquid cooling loop 589 comprises the pump 500 (described below), one or more coolant supply lines 587, one or more coolant return lines 588, and one or more additional cooling loop components 583 such as a heat exchanger, rack-, row-, or datacenter-level coolant distribution unit(s), a chiller, or other cooling components that would be familiar to those of ordinary skill in the art.

The electronic device 590 comprises a PCB 595, such as a baseboard or motherboard of a computing device, and a chassis 594 supporting and housing the PCB 595. The PCB 595 comprises an electrical component 591, such as a processor, power supply unit, memory device, hardware accelerator, or any other electrical component. The electronic device 590 further comprises a cold plate 592 thermally coupled to the electrical component 591.

The electronic device 590 further comprises a pump 500 disposed with in the chassis 594. The pump 500 may be any of the pumps described above, such as the pump 100 and the pump 400. The pump 500 is fluidically coupled with the cold plate 592 via coolant line 596. The pump 500 is electrically connected to the PCB 595 via wires/cable 559 connected to connector 598 of the PCB 595. Thus, the PCB 595 can supply power to and/or communicate with the pump 500. The pump 500 comprises an inlet 531 that may be coupled to the liquid coolant supply line 587 of the liquid cooling loop 589 of the system 580, which supplies liquid coolant to the pump 500. An outlet 532 of the pump 500 is coupled to the coolant line 596. An outlet of the cold plate 592 may be coupled to a liquid coolant return line 588 of the liquid cooling loop, which returns liquid coolant to the remainder of the loop for eventual cooling (e.g., at a heat exchanger). Thus, when the electronic device 590 is installed in the system 580 and fluidically coupled into the liquid cooling loop 589 thereof, liquid coolant from the loop 589 can flow through the pump 500 and cold plate 592. In particular, the pump 500 may be configured to cause (or at least contribute to) the flowing of the liquid coolant through the cold plate 592 to cool the electrical component 591.

In the description above, various types of electronic circuitry or devices are described. As used herein, "electronic" is intended to be understood broadly to include all types of circuitry/devices utilizing electricity, including digital and analog circuitry, direct current (DC) and alternating current (AC) circuitry, and circuitry/devices for converting electricity into another form of energy and circuitry/devices for using electricity to perform other functions. In other words, as used herein there is no distinction between "electronic" circuitry/devices and "electrical" circuitry/devices. In some cases, certain electronic circuitry/devices may comprise processing circuitry. Processing circuitry comprises circuitry configured with logic for performing various operations. The logic of the processing circuitry may comprise dedicated hardware to perform various operations, software (machine readable and/or processor executable instructions) to perform various operations, or any combination thereof. In implementations in which the logic comprises software, the processing circuitry may include a processor to execute the software instructions and a memory device that stores the software. The processor may comprise one or more processing devices capable of executing machine readable instructions, such as, for example, a processor, a processor core, a central processing unit (CPU), a controller, a microcontroller, a system-on-chip (SoC), a digital signal processor (DSP), a graphics processing unit (GPU), etc. In cases in which the processing circuitry includes dedicated hardware, in addition to or in lieu of the processor, the dedicated hardware may include any electronic device that is configured to perform specific operations, such as an Application Specific Integrated Circuit (ASIC), a Field Programmable Gate Array (FPGA), a Complex Programmable Logic Device (CPLD), discrete logic circuits, a hardware accelerator, a hardware encoder, etc. The processing circuitry may also include any combination of dedicated hardware and processor plus software.

It is to be understood that both the general description and the detailed description provide example implementations that are explanatory in nature and are intended to provide an understanding of the present disclosure without limiting the scope of the present disclosure. Other examples in accordance with the present disclosure will be apparent to those skilled in the art based on consideration of the disclosure herein. For example, various mechanical, compositional, structural, electronic, and operational changes may be made to the disclosed examples without departing from the scope of this disclosure, including for example the addition, removal, alteration, substitution, or rearrangement of elements of the disclosed examples, as would be apparent to one skilled in the art in consideration of the present disclosure. Moreover, it will be apparent to those skilled in the art that certain features or aspects of the present teachings may be utilized independently (even if they are disclosed together in some examples) or may be utilized together (even if disclosed in separate examples), whenever practical. In some instances, well-known circuits, structures, and techniques have not been shown or described in detail in order not to obscure the examples. Thus, the following claims are intended to be given their fullest breadth, including equivalents, under the applicable law, without being limited to the examples disclosed herein.

References herein to examples, implementations, or other similar references should be understood as referring to prophetic or hypothetical examples, rather than to devices that have been actually produced (e.g., prototypes), unless explicitly indicated otherwise. Similarly, references to qualities or characteristics of examples should be understood as estimates or expectations based on an understanding of the relevant physical principles involved, application of theory or modeling, and/or past experiences of the inventors, rather than as the results of tests carried out on a physical device, unless explicitly indicated otherwise.

Further, spatial, positional, and relational terminology used herein is chosen to aid the reader in understanding examples of the invention but is not intended to limit the invention to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Furthermore, if a different reference frame is considered than the one illustrated in the figures, then the spatial terms used herein may need to be interpreted differently in that different reference frame. Moreover, the poses of items illustrated in the figure are chosen for convenience of illustration and description, but in an implementation in practice the items may be posed differently.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition. Moreover, unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

What is claimed is:

1. An axial pump for delivering liquid coolant to cool an electronic device, comprising:
   a conduit defining a flow path from an inlet of the conduit to an outlet of the conduit;
   an impeller in the conduit, the impeller comprising:
      a shaft extending parallel to the flow path;
      an impeller body rotatably coupled to the shaft, wherein the impeller body is rotatable relative to the shaft and the conduit about an axis of rotation parallel to the flow path;
   a motor stator configured to drive rotation of the impeller body about the axis of rotation; and
   an adjustment mechanism coupling the shaft to the conduit, wherein the adjustment mechanism is actuatable to cause translation of the impeller shaft and the impeller body relative to the conduit.

2. The axial pump of claim 1,
   wherein the adjustment mechanism comprises internal threads coupled to the conduit and a set screw coupled to the shaft, the set screw having external threads engaged with the internal threads.

3. The axial pump of claim 2, further comprising:
   a locking mechanism configured to, in an applied state, resist motion of the shaft relative to the conduit and resist actuation of the adjustment mechanism.

4. The axial pump of claim 3,
   wherein the locking mechanism comprises a mechanical locking device.

5. The axial pump of claim 4,
   wherein the conduit comprises a rear support;
   wherein the adjustment mechanism comprises a threaded sleeve comprising the internal threads attached to the rear support; and
   wherein the mechanical locking device comprises a friction increasing element coupled to the threaded sleeve which resist rotation of the set screw relative to the threaded sleeve.

6. The axial pump of claim 4,
   wherein the conduit comprises a rear support;
   wherein the adjustment mechanism comprises a threaded sleeve comprising the internal threads attached to the rear support;
   wherein the mechanical locking device comprises a locking nut or a jamb nut attached to the set screw and/or to the threaded sleeve to resist relative rotation therebetween.

7. The axial pump of claim 4,
   wherein the conduit comprises a front support which supports a front portion of the shaft; and
   wherein the mechanical locking device comprises a retention screw configured to engage the front portion of the shaft to resist relative rotation between the shaft and front support.

8. The axial pump of claim 3,
   wherein the locking mechanism comprises a chemical thread locker.

9. The axial pump of claim 2,
   wherein the set screw is coupled to a first portion of the shaft and a second portion of the shaft is engaged with a hub coupled to the conduit, the shaft being supported by the hub and being rotatable and translatable relative to the hub.

10. The axial pump of claim 2,
wherein the conduit comprises a rear support and the adjustment mechanism comprises a threaded sleeve comprising the internal threads and attached to the rear support.

11. The axial pump of claim 10,
wherein the threaded sleeve comprises integral locking features which resist rotation of the set screw relative to the threaded sleeve.

12. The axial pump of claim 2,
wherein the set screw is coaxial with the axis of rotation and comprises a socket facing the outlet and configured to receive a tool inserted along the axis of rotation through the outlet.

13. The axial pump of claim 1,
wherein the impeller comprises one or more blades coupled to the impeller body.

14. The axial pump of claim 13,
wherein the conduit comprises a wall defining a chamber housing the impeller; and
wherein actuation of the adjustment mechanism causes a change in a clearance between a blade tip of one of the one or more blades and the wall of the impeller chamber.

15. The axial pump of claim 14,
wherein the impeller chamber comprises an inlet portion, a central portion, and a transition zone between the inlet portion and the central portion;
wherein, at the transition zone, the wall defining the impeller chamber is sloped relative to the axis of rotation; and
wherein the clearance between the blade tip and the wall defining the impeller chamber is a clearance between the blade tip and the wall defining the impeller chamber at the transition zone.

16. The axial pump of claim 13,
wherein the one or more blades protrude radially from and spiral axially and circumferentially along the impeller body.

17. The axial pump of claim 1,
wherein the adjustment mechanism is accessible for actuation by a tool via the outlet.

18. An electronic device, comprising:
a printed circuit board (PCB);
an electrical component coupled to the PCB;
a chassis housing the PCB;
a cold plate thermally coupled to the electrical component; and
the axial pump of claim 1 disposed within the chassis, wherein the conduit of the axial pump is fluidically coupled with the cold plate.

19. The axial pump of claim 1,
wherein the impeller comprises one or more radial bearings coupled to the shaft and the impeller body, one or more thrust bearings coupled to the shaft and the impeller body.

20. The axial pump of claim 1,
wherein the impeller comprises one or more magnets housed within impeller body, and the motor stator is configured to drive rotation of the impeller body by generating magnetic fields that interact with the one or more magnets.

21. The axial pump of claim 20,
wherein the motor stator comprises two separate stator halves which are disposed on opposite lateral sides of the conduit and which each include portions which protrude partially over the conduit and portions which protrude partially below the conduit.

* * * * *